(12) United States Patent
Foerster

(10) Patent No.: US 8,039,892 B2
(45) Date of Patent: Oct. 18, 2011

(54) SEMICONDUCTOR DEVICE AND A METHOD FOR MANUFACTURING A SEMICONDUCTOR DEVICE

(75) Inventor: Christian Foerster, Villach (AT)

(73) Assignee: Infineon Technologies AG, Neubiberg (DE)

( * ) Notice: Subject to any disclaimer, the term of this patent is extended or adjusted under 35 U.S.C. 154(b) by 306 days.

(21) Appl. No.: 11/740,749

(22) Filed: Apr. 26, 2007

(65) Prior Publication Data

US 2008/0265241 A1    Oct. 30, 2008

(51) Int. Cl.
    *H01L 29/94* (2006.01)
(52) U.S. Cl. .................. 257/329; 257/330; 257/616
(58) Field of Classification Search .............. 257/329, 257/330, 616, E29.193, E21.182
See application file for complete search history.

(56) References Cited

U.S. PATENT DOCUMENTS

| | | | | |
|---|---|---|---|---|
| 5,915,180 | A * | 6/1999 | Hara et al. ............ | 438/270 |
| 6,902,991 | B2 * | 6/2005 | Xiang et al. .......... | 438/510 |
| 7,138,292 | B2 * | 11/2006 | Mirabedini et al. .... | 438/105 |
| 7,238,985 | B2 | 7/2007 | Jones et al. | |
| 7,442,585 | B2 | 10/2008 | Zhu et al. | |
| 7,504,691 | B2 * | 3/2009 | Park et al. ............ | 257/329 |
| 2005/0116217 | A1 | 6/2005 | Jones et al. | |
| 2006/0118863 | A1 | 6/2006 | Dolny et al. | |
| 2006/0289916 | A1 * | 12/2006 | Park et al. ............ | 257/296 |

OTHER PUBLICATIONS

M. Ahoujja et al., "Electrical properties of boron-doped p-SiGeC grown on n-SI substarte" Applied Physics Letters, vol. 77, No. pp. 1327-1329 ( Aug. 2000).*
"High mobility SiGe/Si transistor structures on sapphire substrates using ion implantation", S.A. Alterovitz, et al., J. Vac. Sci. Technol. B 22(4), Jul./Aug. 2004, American Vacuum Society, 2004.
"Mobility Enhancement in Strained Ge Heterostructures by Planarization of SiGe Buffer Layers Grown on Si Substrates", Kentarou Sawano, et al., Japanese Journal of Applied Physics, vol. 44, No. 43, 2005, pp. L1320-L1322.
"Low-energy plasma-enhanced chemical vapor deposition for strained Si and Ge heterostructures and devices", G. Isella, et al., Solid-State Electronics 48 (2004) 1317-1323.
"High mobility SiGe heterostructures fabricated by low-energy plasma-enhanced vapor deposition", H. von Kaenel, et al., Microelectronic Engineering 76 (2004) 279-284.

* cited by examiner

*Primary Examiner* — Howard Weiss
*Assistant Examiner* — Steven Rao
(74) *Attorney, Agent, or Firm* — Dicke, Billig & Czaja, PLLC

(57) ABSTRACT

A semiconductor device is disclosed. In one embodiment, the semiconductor device includes a channel formation region formed on a side wall, having a mixture of a first semiconductor material with a first lattice constant, a second semiconductor material and carbon, the second semiconductor material having a second lattice constant differing from the first lattice constant.

26 Claims, 11 Drawing Sheets

SEMICONDUCTOR DEVICE AND A METHOD FOR MANUFACTURING A SEMICONDUCTOR DEVICE

BACKGROUND

Embodiments of the present invention relate to a semiconductor device and a method for manufacturing a semiconductor device, and particularly to a semiconductor device with increased mobility of charge carriers.

In the development of ever-smaller, more powerful and more efficient power transistors, the complexity of each individual shrink process increases enormously, until technological-physical limits prevent further performance gain. For example, this concerns trench power transistors with silicon as bulk material and geometric sizes that can be reached are not at least limited from technological point of view by the photo technology. Alternative possibilities, such as the known silicon-on-insulator technology and the use of high-k gate dielectrics, cause increased cost by a more expensive substrate and also by the complicated deposition of thin high-k materials.

For these and other reasons, there is a need for the present invention.

SUMMARY

One or more embodiments provide a semiconductor device. In one embodiment, the semiconductor device includes a substrate, a trench structure, a channel formation region and a gate region. The substrate includes a first semiconductor material with a first lattice constant including a first source/drain region in a first depth and a second source/drain region in a second depth. The trench structure is formed in the substrate with a side wall extending from the first source/drain region to the second source/drain region. The channel formation region is formed on the side wall, including a mixture of the first semiconductor material, a second semiconductor material and carbon, the second semiconductor material including a second lattice constant differing from the first lattice constant. The gate region is spaced from the channel formation region across an oxide layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
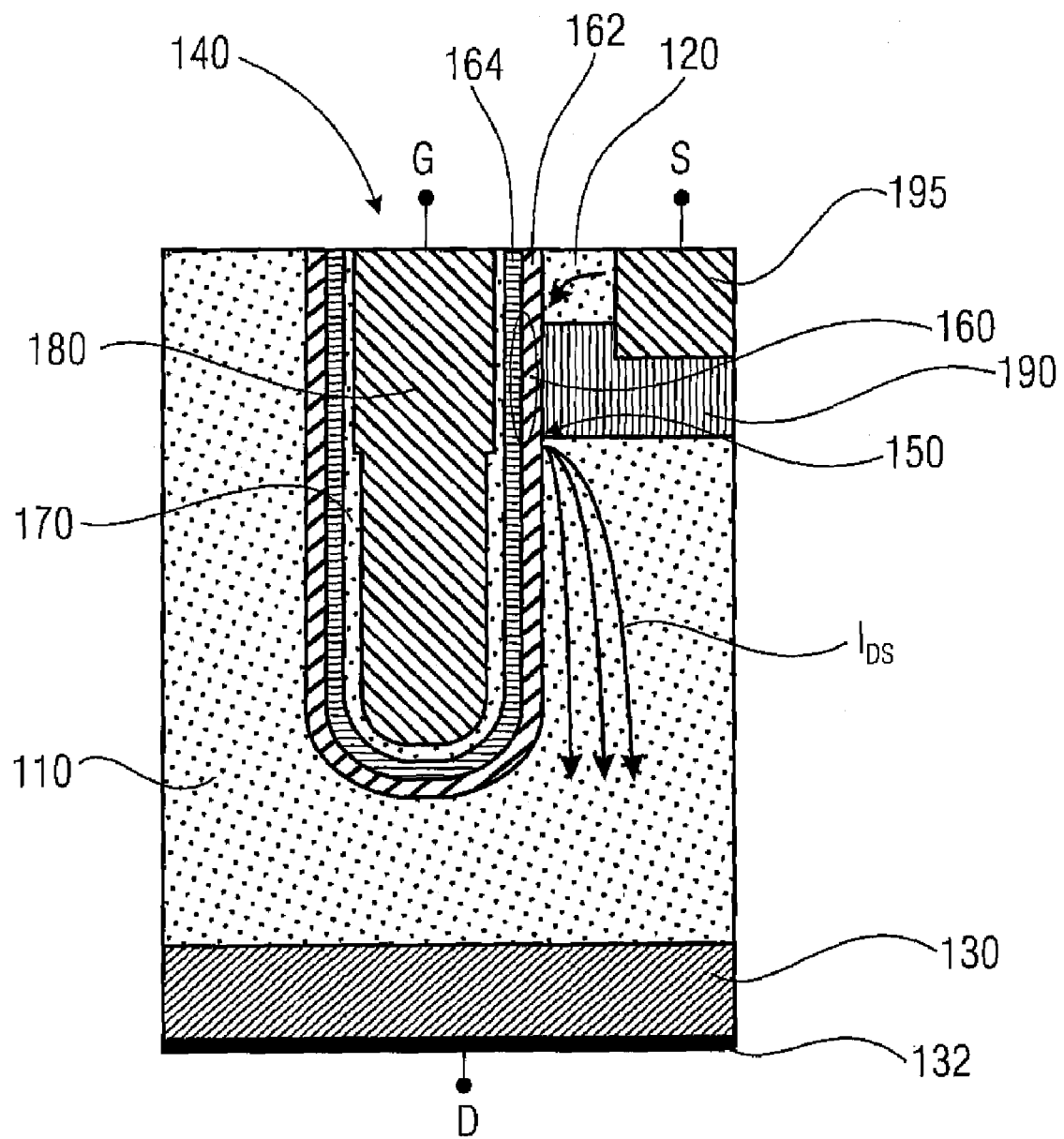
FIG. 1 illustrates a cross-sectional view through a semiconductor device according to an embodiment of the present invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Power MOSFETs (MOS=metal oxide semiconductor; FET=field effect transistor) can be realized in two different designs. In currently common devices, a channel (for charge carrier) is formed horizontally on an upper side—e.g., along a wafer surface—of a semiconductor material and thus, is also known as planar MOS field effect transistor. In contrast, there is the vertical or trench design of power transistors, in which the channel extends along an edge of a trench structure etched into the semiconductor material, and hence a source-drain current flows perpendicularly to the wafer surface. Thus, the power MOSFETs that are realized in the trench design comprise a vertically formed channel. They are in that the drain-side drift path, which is responsible for taking up a breakdown voltage, can be displaced perpendicularly to the semiconductor material, and, in comparison to the planar design, an enormous scaling potential arises. Moreover, in the vertical arrangement of the channel, the channel width can be enlarged significantly, and hence the on-resistance $R_{on}$ can be reduced.

The performance of transistors can be increased if charge carriers have an increased mobility and producing a strained surface layer includes one possibility to achieve this. In the trench technology, to this end, a strained surface layer (e.g., of silicon), which in turn causes an increase in mobility of charge carriers in an evolving channel region, can be produced along the trench. Thus, further performance potential can be utilized. The increased charge carrier mobility of the n- and p-channel devices results from embedding the current-carrying channel of the transistor into a strained silicon layer or a silicon-germanium layer, for example. The lattice-strained thin silicon layer can be achieved by epitaxially growing onto a thin nucleation layer with a greater lattice constant than silicon. The nucleation layer may, for example, comprise SiGe:C or also silicon-germanium, and is of interest particularly also in combination with the trench design of an MOS transistor.

One or more embodiments relate to a semiconductor device. In one embodiment, the semiconductor device includes an integrated circuit. In one embodiment, the semiconductor device includes a substrate with a first semiconductor material with a first lattice constant including a first source/drain region in a first depth and a second source/drain region in a second depth. The semiconductor device further includes a trench structure, formed in the substrate with a side wall extending from the first source/drain region to the second source/drain region. In addition, the semiconductor device includes a channel formation region, formed on the side wall and including a mixture of the first semiconductor material, a second semiconductor material and carbon, the second semiconductor material including a second lattice constant differing from the first lattice constant. Finally, the semiconductor device includes a gate region, spaced from the channel formation region across an oxide layer. Therefore, embodiments relate particularly to MOSFETs or power MOSFETs with a trench gate.

An increase in the charge carrier mobility when using embodiments of the present invention is possible up to a factor of 2 with n-channel devices. This leads to a decrease in the channel resistance, which generally also depends on different starting voltages. Thus, the channel resistance in different MOSFET variants at a gate-source voltage of, e.g., 4.5 volts is almost 40% of the overall resistance of the transistor. With an increase to 10 volts in the gate-source voltage, this proportion reduces to approximately 15% to 20% The mobility gain achieved directly goes into the channel resistance, and at a possible factor of 2, the channel resistance proportion of the overall resistance would halve.

Especially in the p-channel transistors, disadvantaged by the low hole mobility, an enormous improvement of the electrical properties can be obtained by embedding the channel into a strained silicon layer and the slower acting p-channel devices (due to the hole mobility) could be made more profitable for the employment.

The increase in charge carrier mobility may be described by using band-gap engineering. Here, the aim basically is to further increase a drain-source current ($I_{DS}$) of a transistor, namely in particular by a reduction of the on-resistance of the transistor. For reducing the on-resistance, the ratio of channel width to channel length and the gate oxide (for example the thickness) plays an important role. As far as it is desired to do without further shifting of the channel width/channel length ratio, and it is not desired to change from silicon oxide to a high-K material for the gate oxide, a possible lever for a performance increase is given by an increase in mobility of the charge carriers. The mobility of the charge carriers directly influences the on-resistance $R_{ON}$ of the transistor via a variation or modification in the conductance, and thus leads to a change of resistivity.

The mobility of the charge carriers, no matter if for electrons or holes, is closely linked to the course of the energy bands (conducting band and valence band, band etches, transitions, etc.) and is influenced via the curvature of the energy bands (or the second derivative of the energy with respect to the momentum) and the effective mass connected thereto. Lattice strains, which may for example be built up by biaxial tensile and compressive strain in the silicon lattice, lead to deformations of the individual energy bands. This deformation is mirrored in a change of the effective mass of the charge carriers and leads to a reduction in the effective mass, and hence to the effect of mobility increase of the charge carriers, in particular. The stronger the energy bands are deformed by a strained lattice structure, the lower the effective mass of the charge carriers may become. A further positive effect in this connection is a possible increase in scattering time by injected tensile or compressive strain in the crystal lattice. The scattering time is the time in which a charge carrier particle typically passes between two scattering events, and may thus be expressed indirectly via the mean free path length. The mean free path length is in turn of the order of magnitude of the lattice or the lattice period (Bloch theorem). Both effects, i.e. the increase in the scattering time on one hand and the reduction of the effective mass, increase the mobility of the charge carriers and lead to a reduction of the $R_{ON}$ of the transistor.

When using a silicon-germanium layer with addition of carbon (SiGe:C), the addition of the element carbon can be done at a concentration of, for example, less than 1%, the crystal lattice can be strained very strongly, and temperature resistance of the mixed crystal can be very high. Thus, a high process temperature of the following technological processes becomes possible.

As an alternative to the addition of carbon, the growing of an exemplary 20 nm thin silicon-germanium layer takes place with a variation in the germanium content in the layer, beginning with a low concentration at the interface between the silicon substrate and the silicon-germanium layer toward higher concentration of the germanium in the mixed crystal. Thereafter, e.g., 5 nm of the silicon-germanium layer can still be applied with a constant proportion of germanium. One reason for the gradual increase in the germanium concentration lies in the lattice strain, which naturally increases with rising germanium proportion in the mixed crystal. Beginning with the epitaxy on the silicon and the silicon interface, the silicon-germanium layer tries to adapt to the silicon lattice. Since the lattice constant of silicon is smaller than that of germanium, this leads to a strain in the lattice structure. In order to avoid dislocation and defects, which may, for example, represent a reason for unwanted leakage currents in the grown silicon-germanium layer, it is started with a low concentration of germanium, for example $Si_{0.90}Ge_{0.10}$ or $Si_{0.85}Ge_{0.15}$, and the germanium proportion is increased step by step up to e.g., 30%, i.e. until $Si_{0.70}Ge_{0.30}$ is reached. Depending on the high-temperature processes still to follow and a breakdown voltage to be reached, higher concentrations may also be chosen. The proportion of germanium in the epi-layer here determines the degree of strain. The more Germanium there is contained, the more strained the silicon layer grown onto the silicon-germanium layer in the following in the manufacturing process will be, which in turn positively affects the band bending (effective mass), and hence the carrier mobility.

At a high germanium proportion however, the subsequent processes are limited, e.g., with respect to the temperature (about 500° C.) and/or toward germanium out-diffusion. For this reason, lowering the melting temperature by the addition of germanium, as well as lowering possible breakdown voltage realized in this technology is even more important.

The silicon-germanium layer may thus be described or manufactured as a 2-layer system. At first, a thin silicon-germanium buffer layer with increasing germanium content from the silicon interface is realized (at a layer thickness of about 15-20 nm), and then an about 5-10 nm thin silicon-germanium layer is deposited with constant germanium proportion. Here, the critical layer thickness of silicon-germanium is to be noted, which is strongly dependent on the temperature, the substrate, and the germanium concentration. In this realization, the strain increases continuously in the silicon-germanium layer from the substrate, until it reaches a maximum at the interface of the silicon-germanium layer to the adjoining strained silicon layer, which is also deposited epitaxially.

The thickness of the epitaxially deposited silicon layer depends on the following trench concept, that is, whether this is to be realized with or without a field plate. The thickness of the strained grown silicon layer thus is adapted to the respective technology (with or without field plates). In the subsequent thermal oxidation of the silicon layer, the gate oxide develops in a standard trench variant (A), whereas the field oxide as well as the gate oxide develops (during the thermal oxidation) in a trench variant with field plate (B). In the processing with the variant (A), that is the standard trench variant, the thermal oxidation of the gate-oxide takes place under consumption of the strained silicon layer. Thereafter, filling the trench with polysilicon, e.g., may take place, in order to form a gate region. In the variant (B), that is, in a trench with field plates or field oxides, a thicker strained silicon layer is oxidized, which then offers enough hold for the field oxide and the gate oxide. During this oxidation, the strained grown silicon layer can be consumed partially, or maybe also completely.

In the deposition of the silicon-germanium layer as buffer layer, it is to be noted that the layer thickness of the buffer layer from above is limited by the fact that a cell pitch is generally default externally and should not be enlarged. For this reason, the general aim is given by realizing the layers as thinly as possible, so that a strain still develops. For the strained silicon layer, it is to be noted that the silicon layer starts to relax starting from a certain layer thickness, which eliminates the desired effect. This strongly depends on the layer composition as well as on the process temperatures from which layer thickness on relaxation occurs. In silicon-germanium, layer thicknesses of up to 1 μm are possible, without a relaxation or the critical layer thickness being reached (always with reference to the germanium content and the temperatures).

One or more embodiments relate also to a method of manufacturing a semiconductor device. In one embodiment, the method of manufacturing a semiconductor device includes an integrated circuit. One embodiment includes providing a substrate of a first semiconductor material with a first lattice constant including a first source/drain region in a first depth and a second source/drain region in a second depth. The method further includes a process of forming a trench structure with a side wall in the substrate, wherein the side wall extends from the first source/drain region to the second source/drain region. In addition, the method includes a process of epitaxially forming a channel formation region on the side wall, wherein the channel formation region includes a mixture of the first semiconductor material, a second semiconductor material and carbon, the second semiconductor material including a second lattice constant differing from the first lattice constant. Finally, the method includes a process of forming an oxide layer separating the channel formation region from a gate region.

Thus, a starting point for the manufacturing according to embodiments of the present invention is, for example, a silicon substrate with a doped silicon epi-layer (epitaxially formed layer), to which a hard mask, e.g., can be applied and patterning is performed. By lithographically realized windows in the hard mask, trench etching of a trench can be done (e.g., about 3 μm deep into the Si epi-layer). Thermal oxidation can take place after the trench etch. A thin oxide layer of, for example, 75 nm thickness thus developed, is removed in the following by a wet-chemical etching process. This oxidation of a thin oxide and the ensuing removal of the oxide layer is also referred to as rounding process, and the oxide is also referred to as round oxide. In this process step, the etched trench is rounded geometrically, particularly at the trench bottom, which plays an important role for the ensuing oxidation of the gate-oxide (GOX) or of a field plate oxide (FOX). In addition, the radiation damage caused by the plasma etch on the trench side wall and on the trench bottom can be removed. Then, epitaxial deposition of e.g., an SiGe:C layer or alternatively a 20 nm thin silicon-germanium is done over the complete cell structure (planar and in the trench).

A realization of a trench transistor with a strained surface layer in accordance with embodiments of the present invention would imply changes in the processing. A modified method could include the following processes or part of them:

current process flow up to the photo technique X (trench level);

cleaning and removing radiation damage caused by the trench etching;

an optional epitaxial step for manufacturing a buffer layer of silicon-germanium (SiGe) with increasing germanium content toward the interface of the resulting epi-layer (away from the side wall), such that the deposition should not influence a trench taper;

epitaxial deposition of a silicon-germanium with a carbon proportion (SiGe:C) or a (ideally defect-free) relaxed silicon-germanium as a nucleation layer, wherein the deposition can again take place such that the trench taper is not influenced;

epitaxy of silicon, which strains due to the lattice match to the nucleation layer (i.e. the SiGe or SiGe:C layer) and modulates the charge carrier mobility by a high biaxial tensile stress; the epitaxy can again take place such that the deposition does not influence the trench taper;

continuation of a conventional process sequence, which may include oxidizing a field plate in the strained silicon layer, as well as later gate oxidation. The channel of the transistor can then be directly in the strained silicon layer, which can be few nanometers thin defined by the thickness of the deposited strained silicon layer and the gate oxidation.

Thereby, by inserting only a few processes, a double or triple epitaxy (depending on the degree of strain) in the trench, a production of strained silicon MOSFET becomes possible.

One advantage in the employment of silicon-germanium lies in the compatibility with the silicon technology and a relatively easy-to-realize integration into the MOS or CMOS technology. In the charge carrier mobility modulation caused by a lattice strain, increased attention is required in the subsequent high-temperature processes, for example the oxidation of the field plate, the gate oxide, and in various drives after implantations. In these processes, usually temperatures of more than 1000° C. are used, and use of silicon-germanium is very strongly limited at these temperatures, which concerns the composition of the mixed crystal and also may cause germanium out-diffusion into the channel region. But this is not comparable to a diffusion of boron, arsenic or phosphor, since the germanium would only diffuse few nanometers into the strained silicon via the interface (<10 nm, temperature dependent). A further critical quantity in the process execution is a possible relaxation of the strained silicon by the temperature influence as well as the exact layer thicknesses and composition of the different layers as e.g., the silicon-germanium layer and the silicon.

Use of a SiGe:C layer instead of the silicon-germanium layer with gradually increasing germanium proportion, for example, is in that the optical and, above all, electrical properties are improved, as compared with a pure silicon-germanium layer (without carbon proportion). A main advantage is, however, that by the incorporation of carbon the mixed crystal becomes substantially more temperature stable, and a change of strain as opposed to the silicon-germanium can once again be attained via the carbon content (e.g., <5% or in many cases smaller than 1%). The element of carbon does not limit the ensuing processes as strongly with respect to the temperature. In a pure silicon-germanium layer, the limitation with respect to the temperature lies at about 500-600° C., whereas an addition of carbon raises the limitation to about 700-800° C., but with these values being dependent on the germanium proportion. In the application of the SiGe:C, no silicon-germanium buffer layer has to be used, wherein the epitaxy of this layer leads to defects and inaccuracies in the lattice match, which is not the case when using a silicon-germanium buffer layer. But since a significantly higher temperature tolerance, which should not be lost by renewed formation of a silicon-germanium layer as buffer layer, is achieved by the addition of carbon possible defects in the epitaxy can be accepted. Likewise, the diffusion coefficient is changed, and hence the danger of unwanted diffusion into the channel is reduced. Use of SiGe:C, however, causes a momentary defect density in epitaxially deposited layers as opposed to highly perfect silicon-germanium epi-layers.

It should be understood, that the use of silicon, germanium, carbon and their mixtures are examples of possible materials, which can offer some advantages (due to well-known technology, for example), but in further embodiments other materials can be used as long as the lattice constants of the used material differ, so that a strained lattice emerges.

FIG. 1 illustrates a semiconductor device according to one embodiment with a substrate 110, a source region 120, and a drain region 130. In the substrate 110, a trench structure 140 is formed, and a channel formation region 160 is formed along a side wall 150 of the trench structure 140. The channel formation region 160 includes a base layer 162 and a strained semiconductor layer 164. The channel formation region 160 is separated from a gate region 180 across an oxide layer 170. The substrate 110 may have the same doping as the source region 120, wherein both regions are separated by a body region 190 having complementary doping. As a rule, the body region 190 can be applied to a source potential through a via-contact 195, and the source region 120 is contacted via a source terminal S, the drain region 130 via a drain terminal D and the gate region 180 via a gate terminal G. Optionally, the drain region 130 may comprise an optional contact layer 132, in order to enable improved removal and supply of charge carriers, and which may, for example comprise a metal. The drain region 130 itself may be formed by a higher doped region of the substrate 110.

If a corresponding signal is present at the gate terminal G, the formation of a current channel takes place in the channel formation region 160, so that a current flow $I_{DS}$ between the source region 120 and the drain region 130 is enabled. The gate terminal G serves as control terminal for the semiconductor device, so that the current channel can be opened or closed, and thereby the current flow between the source terminal S and the drain terminal D is controlled by the gate terminal G. The exact location of the current channel in the channel formation region 160 depends on the channel type, which again depends on the chosen doping of the source region 120 and of the drain region 130, as well as the body region 190 (further details will follow further below).

Figure 2:
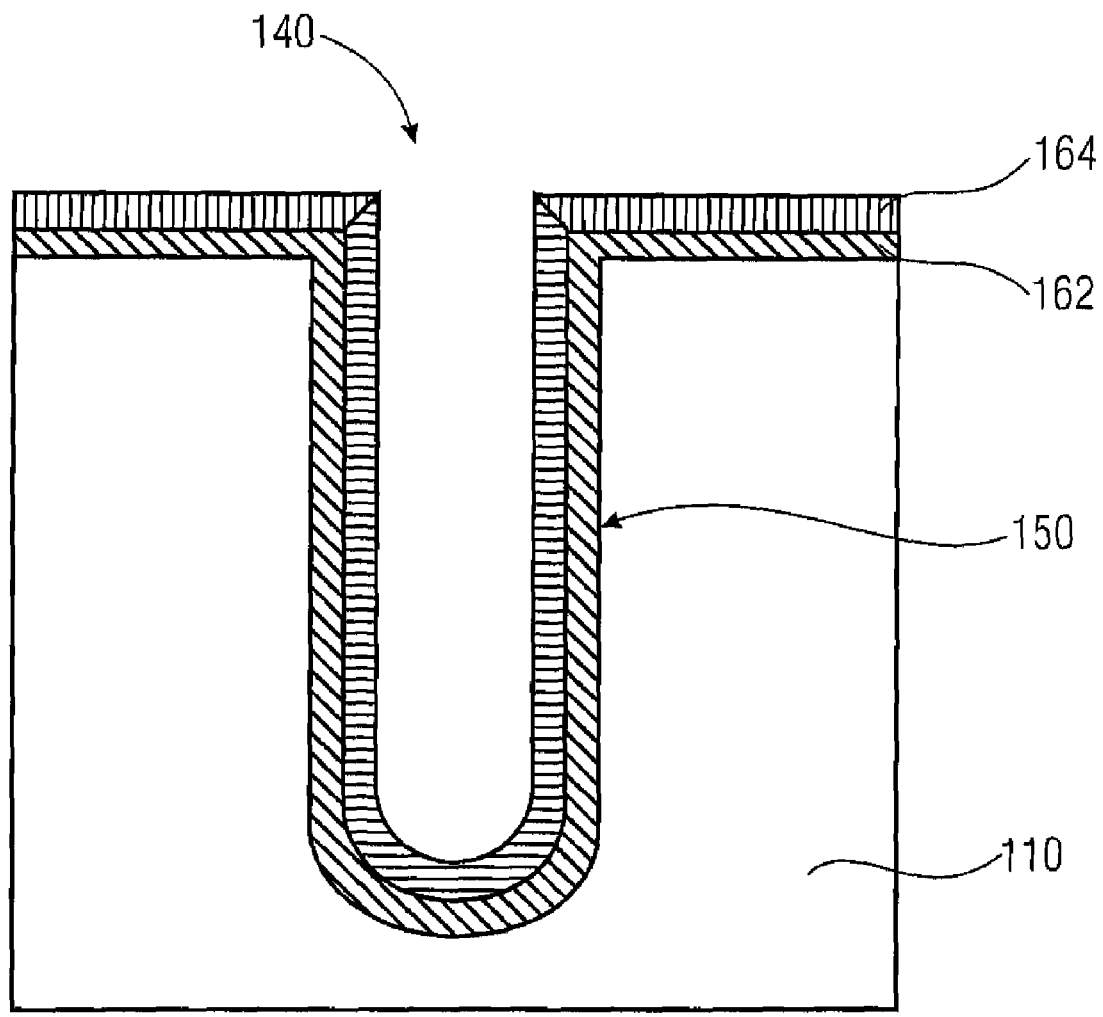
FIG. 2 illustrates a cross-sectional view through a trench with a base layer and a semiconductor layer.

In FIG. 2, a cross-sectional view through a trench 140 in the substrate 110 with the base layer 162 and the strained semiconductor layer 164 is illustrated, wherein the structure, as it is illustrated in FIG. 2, arises as a result of a process sequence that will be described in FIGS. 3A-3E. The base layer 162 may, for example be deposited in a nanometer range and can comprise the SiGe:C layer. Alternatively, the base layer 162 can comprise a combination of silicon-germanium buffer layer with continuously rising germanium proportion and a silicon-germanium layer. The base layer 162 thus serves as a multi-layer stack for strain build-up. Finally, the strained semiconductor layer 164 is epitaxially deposited on the base layer 162 and includes silicon, for example. The layer thickness of the strained semiconductor layer 164 may include a few nanometers and may have high biaxial strain. Subsequent process flows are embedded into the strained silicon surface layer 164. The epitaxy in the trench 140 to form the base layer 162 is formed as a standard epi layer, inclusive of ensuing processes up to the trench etch (including cleaning and removal of radiation damage), is critical in the process execution.

Figure 3:
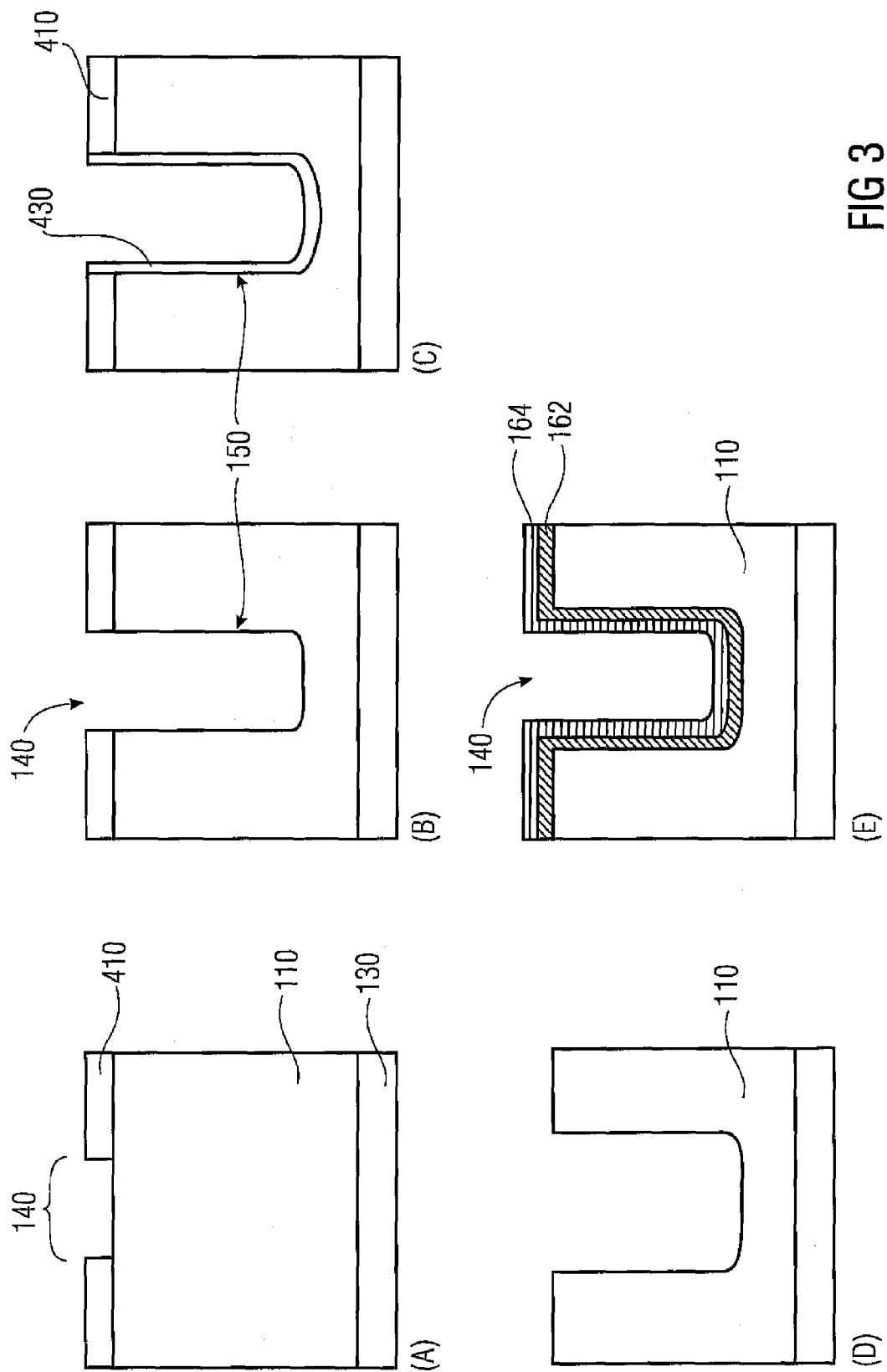
FIG. 3 illustrates a step sequence for the production of the trench structure illustrated in FIG. 2.

FIG. 3 illustrates a process flow for fabricating the structure illustrated in FIG. 2. At A, a hard mask 410 is applied on the substrate 110, wherein a window 420 marks the trench 140 to be formed. On the side of the substrate 110 opposite the mask 410, a further substrate region is marked, which will later be formed to be the drain region 130. The following procedural at B illustrates the trench 140 is formed by using a trench etch, for example at a depth of about 1 to 5 µm or approximately 3 µm. Then, at C thermal oxidation is performed, so that a surface oxide layer 430 forms along the trench side wall 150 and the trench bottom. The surface oxide layer 430 may for example comprise a thickness of about 75 nanometers and is removed again, for example by a wet-chemical etching method, at D. At the same time, the hard mask 410 is also removed. This represents the previously described rounding process, and the oxide layer 430 is also known as round oxide. Next, at E, the base layer 162 is epitaxially grown in the trench 140 into the substrate 110 followed by the strained semiconductor layer 164 (which can comprise silicon).

Because the base layer 162 serves for strain build-up, it can comprise SiGe:C with a carbon concentration of about 1% or less. Alternatively, the base layer 162 can be, for example, a silicon-germanium mixture with the germanium proportion being slowly rising. Within 20 nm, the germanium proportion may, for example, rise up to 30%, and a layer of silicon-germanium with constant germanium proportion can follow. The layer with constant germanium proportion may for example have a thickness of 5 nm. The strained semiconductor layer 164 (e.g., as silicon interface layer) can comprise a thickness of about 10 nm.

In the now following process flow, it is differentiated between a standard trench—the variant (A)—and a trench in the field plate concept—the variant (B).

Figure 4:
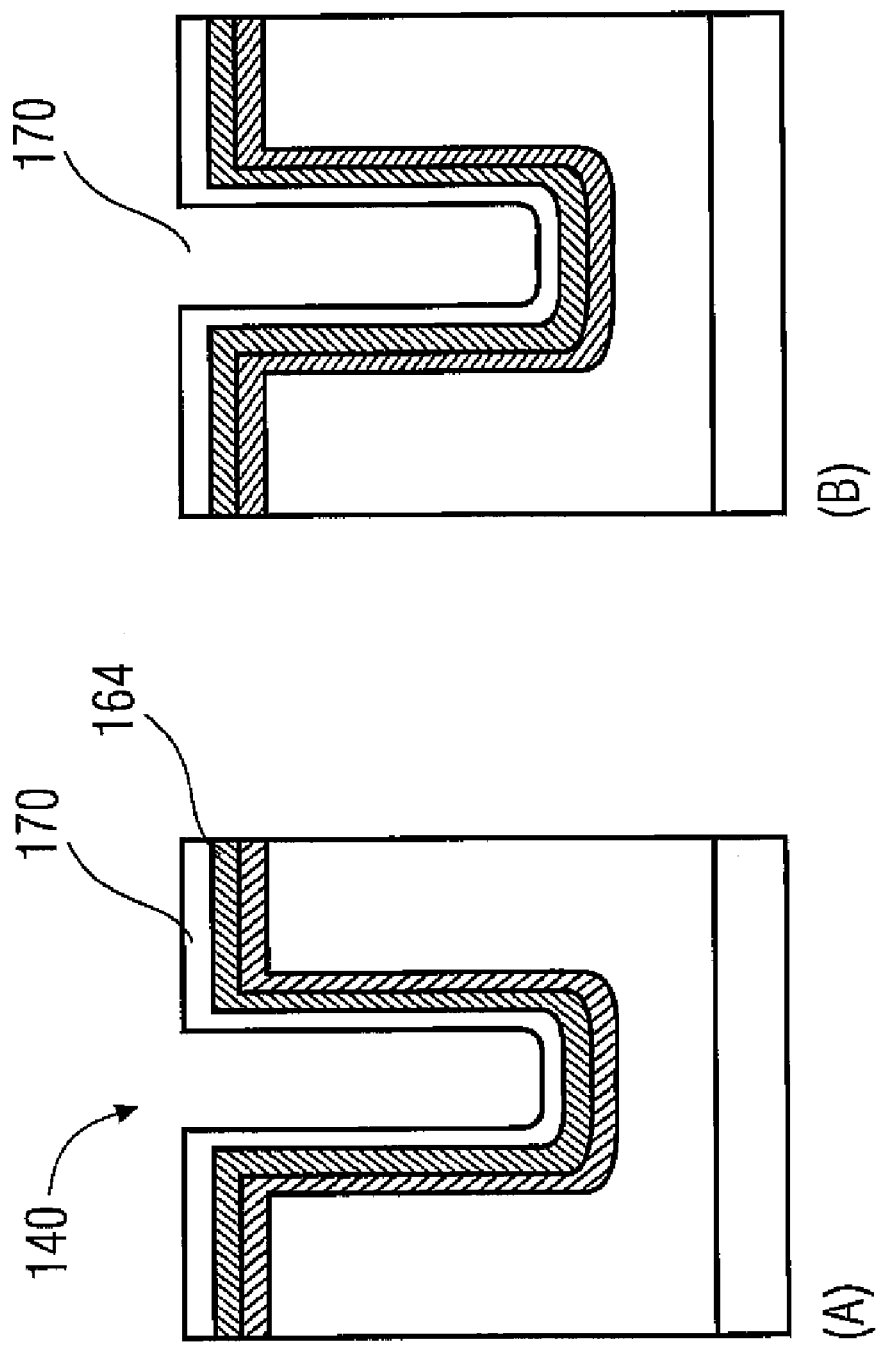
FIG. 4 illustrates a step sequence for producing a standard trench.

FIG. 4 illustrates the procedural processes for a variant (A). To this end, at first (at A), part of the strained silicon layer 164 is oxidized so as to form an oxide layer 170. The trench 140 thus obtained is finally (at B) filled with material (polysilicon, for example) to form the gate region 180.

Figure 5:
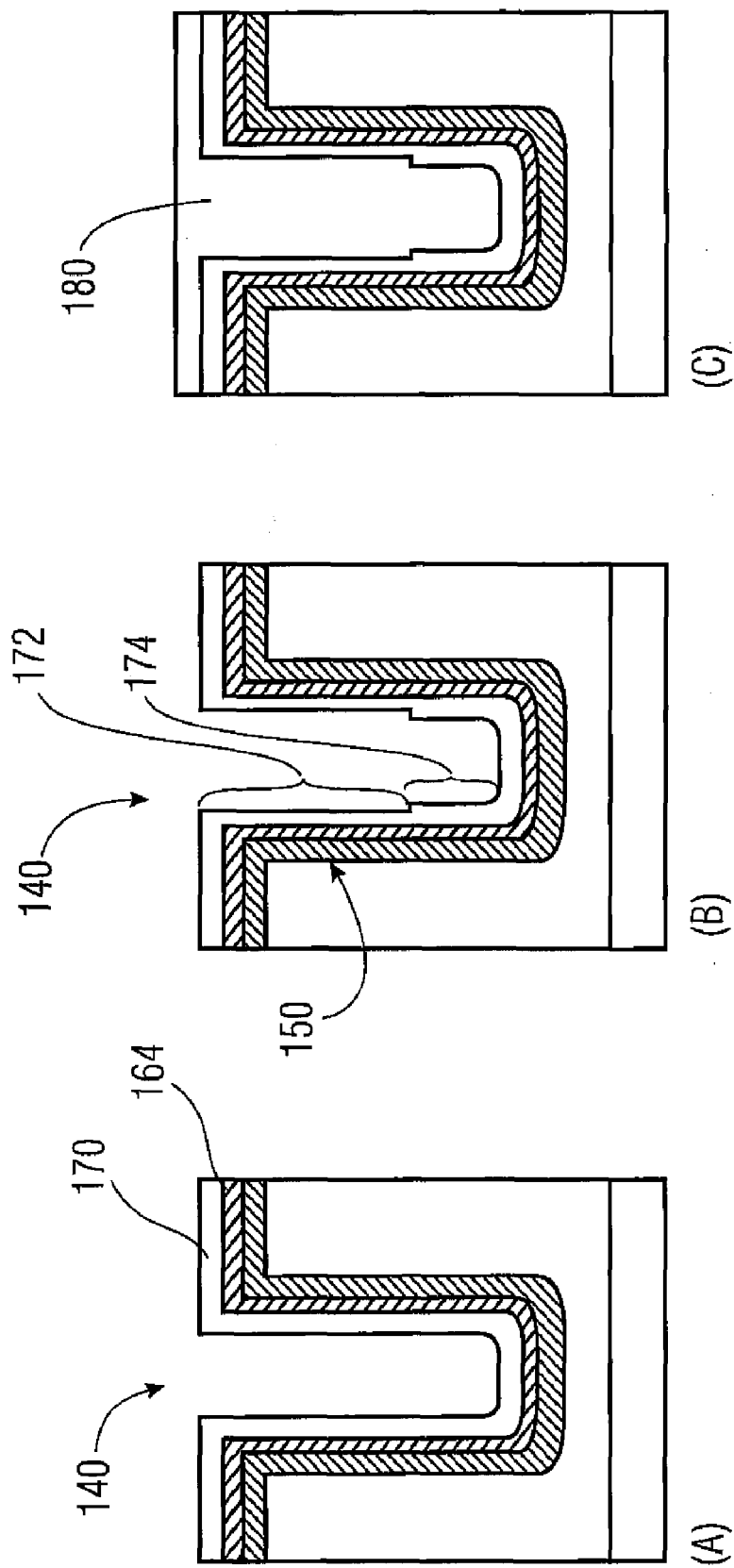
FIG. 5 illustrates a step sequence for producing a trench with a field plate.

FIG. 5 illustrates an alternative process flow to obtain a trench in the field plate concept corresponding to variant (B). In this process flow, the strained semiconductor layer 164 is formed to be correspondingly thicker, and a correspondingly thicker oxide layer 170 is created by thermal oxidation, e.g., as a result. Then at B, the oxide layer 170 is thinned along the trench side wall 150 in the upper area of the gate oxide 172. Thus, the oxide layer 170 remains with a greater layer thickness in the lower area 174 to form the field plate oxide. At C, the trench 140 thus developed is in turn filled with a material (e.g., Polysilicon), which will later form the gate region 180. The ensuing process flow concerning the structure, as it is illustrated in FIG. 1, for example, is not illustrated.

Figure 6:
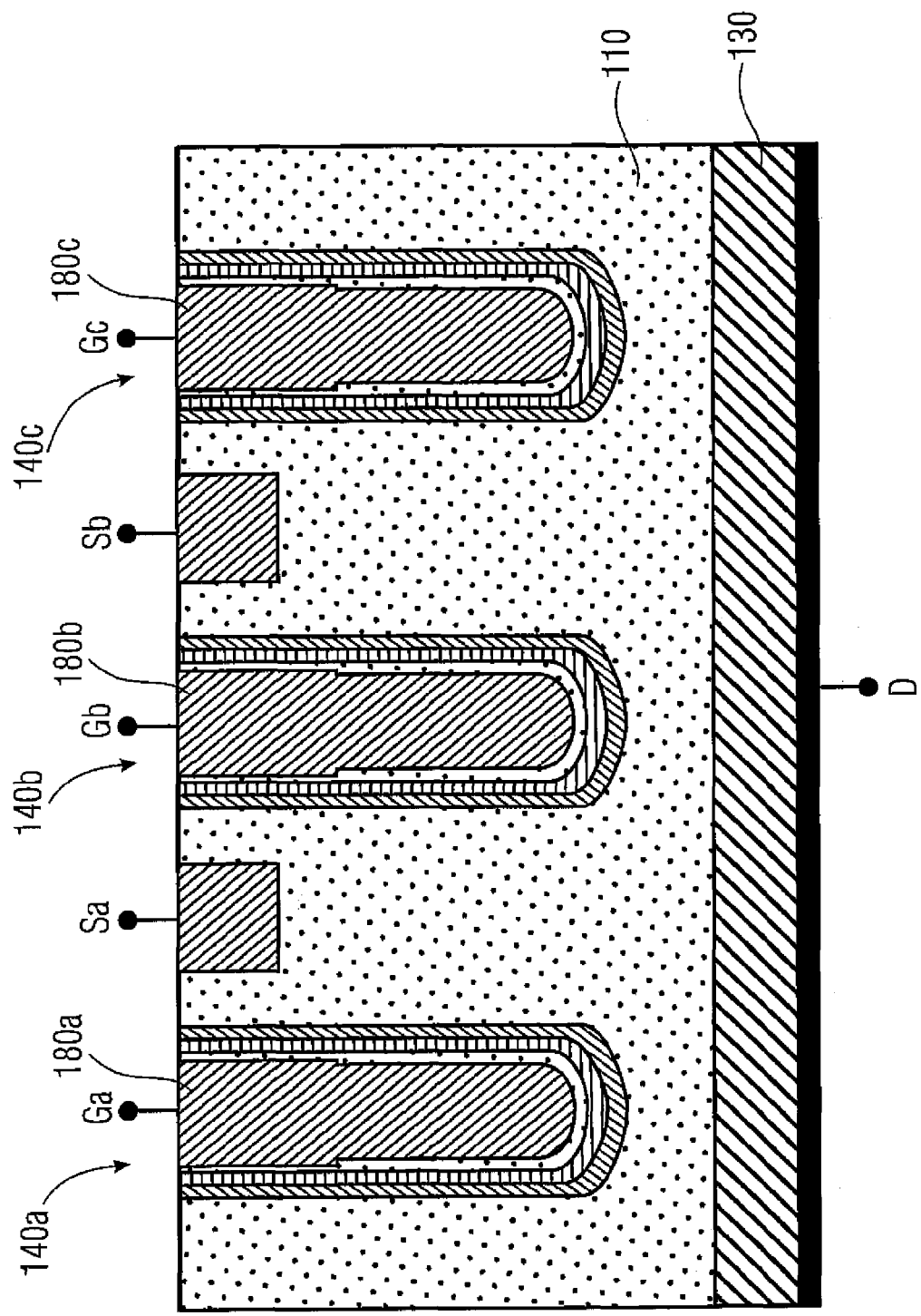
FIG. 6 illustrates a trench geometry of adjacent trenches.

FIG. 6 illustrates an intermediate product in manufacturing of a trench transistor having several trenches 140a, 140b, 140c, . . . , but with source regions 120 and body regions 190 not yet being formed. Each of the three trenches 140a, 140b, 140c comprise gate regions 180a, 180b, 180c with gate terminals Ga, Gb, Gc. Source terminals Sa, Sb, . . . are formed furthermore between adjacent trenches, that is, a source terminal Sa is formed between the trenches 140a and 140b and a source terminal Sb is formed between the trenches 140b and 140c. Opposite to the gate terminals Ga, Gb, Gc, the drain terminal D connecting the drain region 130 of the substrate 110, is formed. All further structures correspond to the structures already described in FIG. 1.

Figure 7:
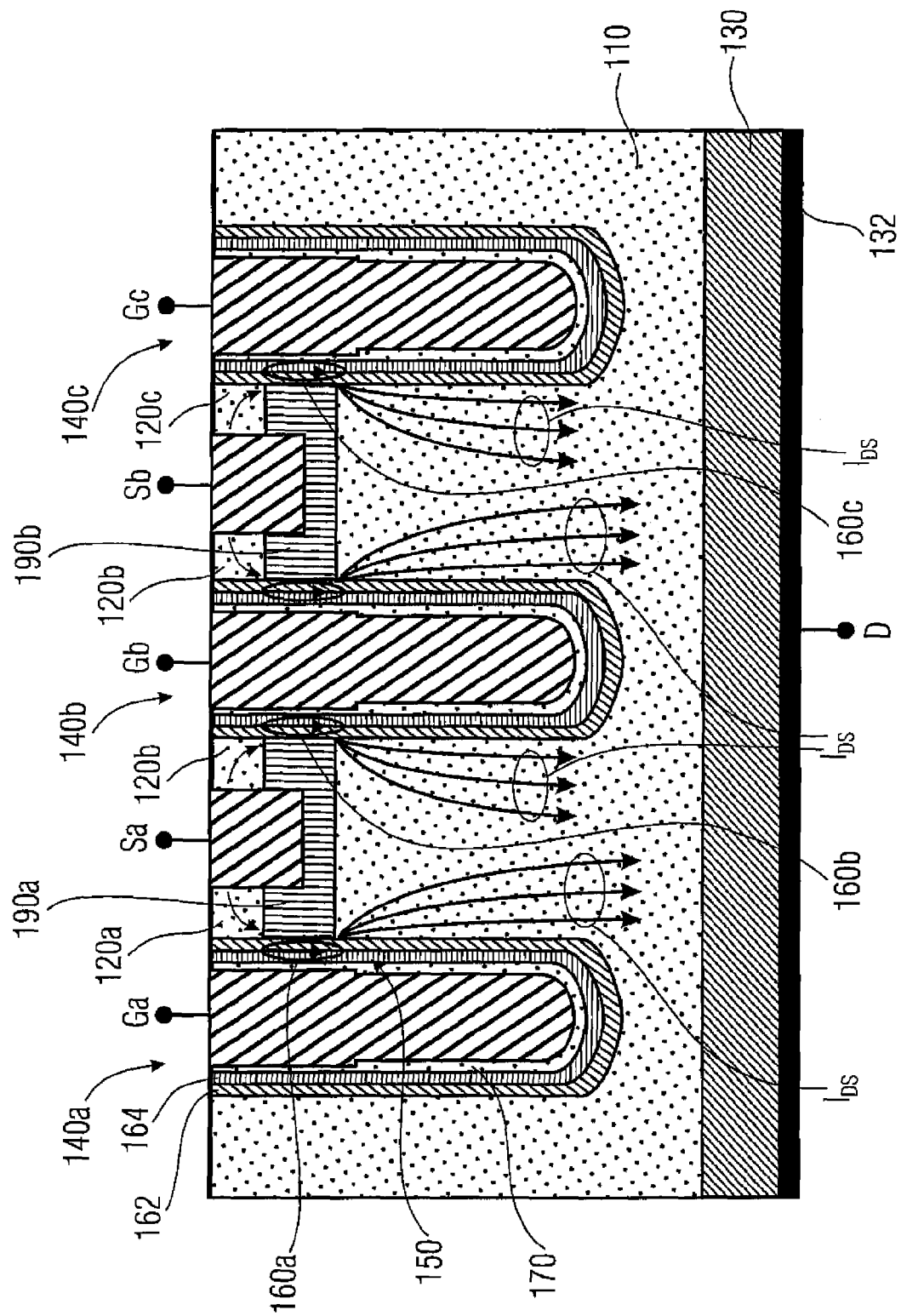
FIG. 7 illustrates a power field effect transistor with several adjacent trenches.

FIG. 7 illustrates a semiconductor device according to an embodiment with three adjacent trenches 140a, 140b and 140c, with a first source terminal Sa being formed between the first trench 140a and the second trench 140b, and a second source terminal Sb between the second trench 104b and the third trench 140c. The first trench 140a includes a first gate terminal Ga, the second trench Gb a second gate terminal Gb, and the third trench 140c a third gate terminal Gc. The substrate 110 includes on the side opposite the adjacent trenches 140, like in FIG. 1, also a drain region 130 with a final contact layer 132, which contacts the drain terminal D. The source terminals Sa, Sb, . . . contact both the source regions 120a, 120b, 120c and the adjoining body regions 190a, 190b, . . . . Each trench 140 includes, on at least one side wall 150, the channel formation region 160a, 160b, 160c with the base layer 162 and the strained semiconductor layer 164 each, which corresponds to the structure described in FIG. 1 (for this reason repeated description is omitted here). In general, the source terminals Sa, Sb . . . as well as the gate terminals Ga, Gb, Gc, . . . are interconnected, so that parallel current flow $I_{DS}$ through the various channel formation regions 160a, 160b, 160c, . . . develops.

As an example, the source region 120 may be n-doped and the body regions 190 p-doped. In this case, the substrate 110 is slightly $n^-$-doped and the drain region 130 is strongly $n^+$-doped (or $n^{++}$-doped). The contact layer 132 may for example comprise a metal. In this case, an n-channel forms in the channel formation regions 160. In the complementary case, that is, if the source and drain regions 120, 130 are p-doped and the body regions 190 is n-doped, a p-channel forms in the channel formation region 160. Correspondingly, an n-channel trench MOSFET or a p-channel trench MOSFET is obtained.

In case the strained semiconductor layer 164 is completely consumed in the oxidation of the field plate or of the gate oxide 170, the channel can form in the base layer 162, which either includes silicon-germanium or SiGe:C, in p- and n-channel transistors. But if the strained semiconductor layer 164 remains after the oxidation of the gate oxide 170 (e.g., of about 10 nm layer thickness), the current channel can form in the strained semiconductor layer 164 in the p-channel transistor and in the base layer 162 in the n-channel transistor (that is in the silicon-germanium or SiGe:C).

Figure 8:
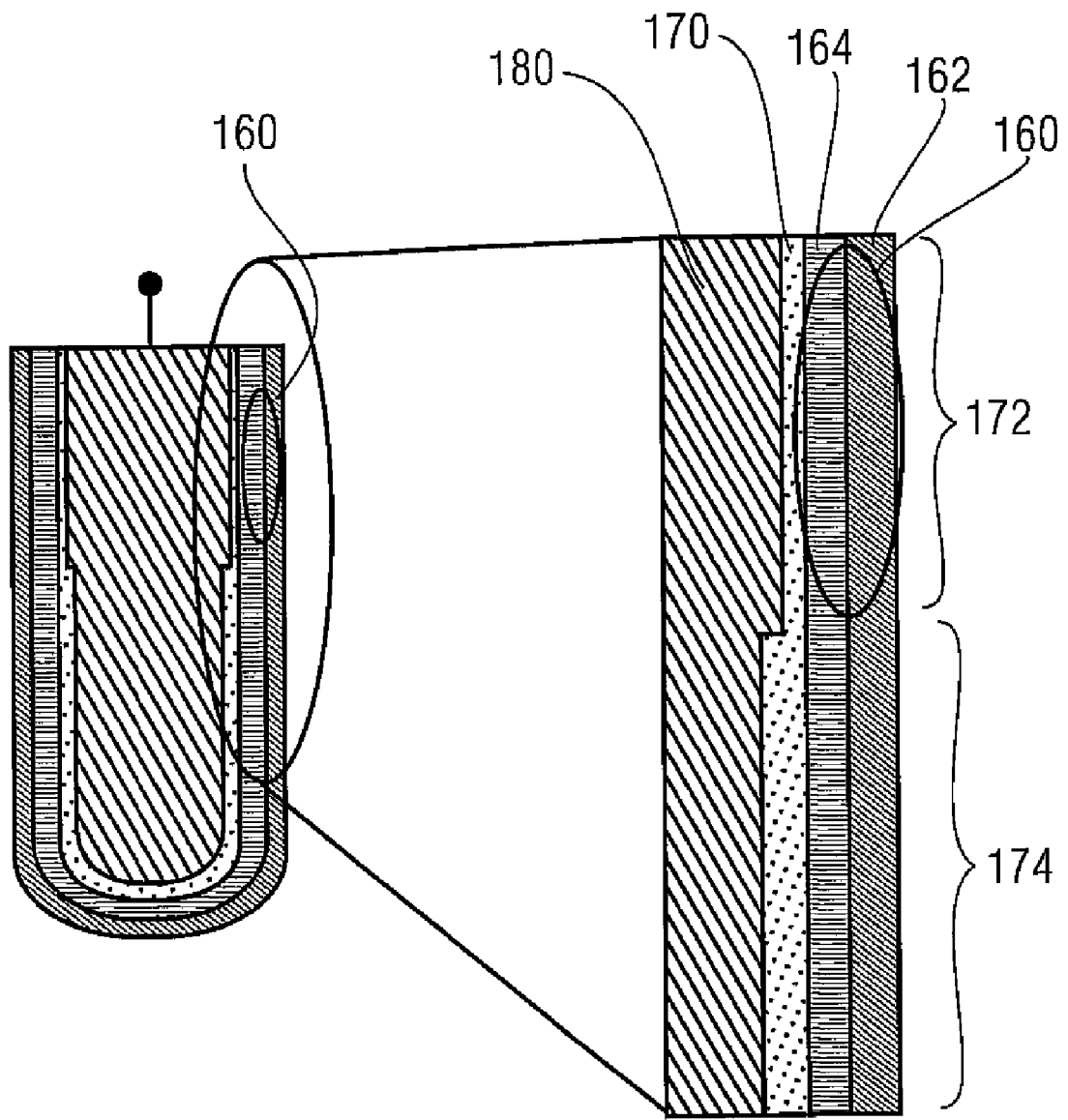
FIG. 8 illustrates an enlarged illustration of a trench side wall.

FIG. 8 illustrates an enlarged cross-sectional view of the channel formation region 160, the adjoining oxide layer 170 and the gate region 180. The channel formation region 160 in turn includes a base layer 162, which serves for strain build-up, and a strained semiconductor layer 164 (e.g., of silicon). Adjoining there is the oxide layer 170, which separates the gate region 180 from the channel formation region 160. The oxide layer 170 includes smaller layer thickness in an area of a gate oxide 172 than in an area of a field plate 174. The thicker field plate oxide 174 is supposed to improve breakdown strength, in particular, since higher field strengths (high gate-drain voltages) may occur in the lower trench area.

Figure 9:
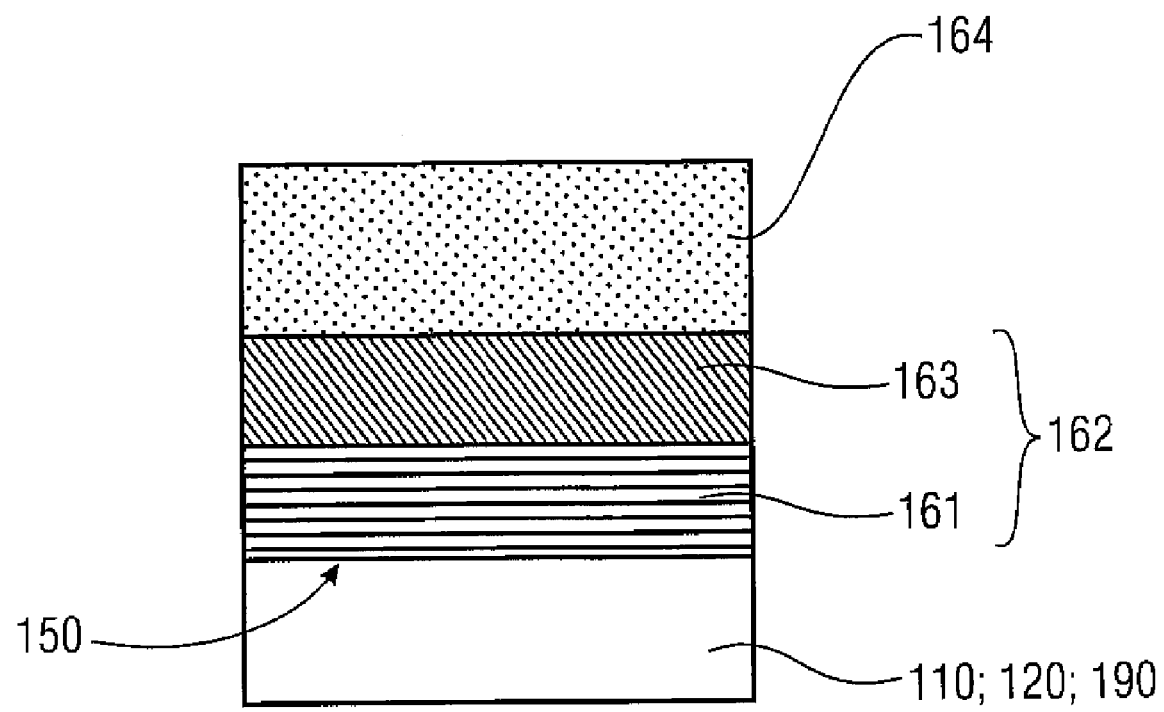
FIG. 9 illustrates a layer illustration of the layers deposited along the trench side wall.

FIG. 9 illustrates a design for the channel formation region 160 which is formed along the trench side wall 150. The trench side wall 150 can be either along the substrate 110, along the source region 120 or along the body region 190 (see FIG. 1). At first a buffer layer 161 can be formed on the trench side wall 150, whereupon a nucleation layer 163 and finally the strained semiconductor layer 164 can be grown. The buffer layer 161 and the nucleation layer 163 form the base layer 162 and serve for build-up of a background with as little defects as possible, on which for example silicon in the semiconductor layer 164 can be grown, so that a strained surface layer develops. The SiGe:C layer with a thickness of 10 to 50 nm can be used as the nucleation layer 163 for the ensuing silicon layer. Alternatively, the buffer layer 161 may, for example, comprise a layer thickness between 15 and 25 nm and a gradually increasing proportion of germanium (toward the nucleation layer 163). The nucleation layer 163, which is adjoining thereto, may for example have a layer thickness ranging from 5 to 15 nm, wherein the nucleation layer 163 may have a constant proportion of germanium, which for example lies at 30% ($Si_{0.70}Ge_{0.30}$). The semiconductor layer 164 may for example be applied with a layer thickness of 40-120 nm and may for example comprise pure silicon. Here, the layer thickness can be chosen so that in an ensuing oxidation process part (may be also the complete) of the semiconductor layer 164 is consumed, so that finally a strained silicon surface layer of about 10 nm remains, and the oxidation layer 170 has a desired layer thickness.

In the buffer layer 161 ($Si_yGe_{1-y}$), the germanium proportion may rise from 0% to 30%. It is also possible to let the layer begin to grow on the background with a 5% germanium proportion or also with a 10% germanium proportion, wherein either the substrate 110 or the source region 120 or the body region 190 may serve as background.

Figure 10:
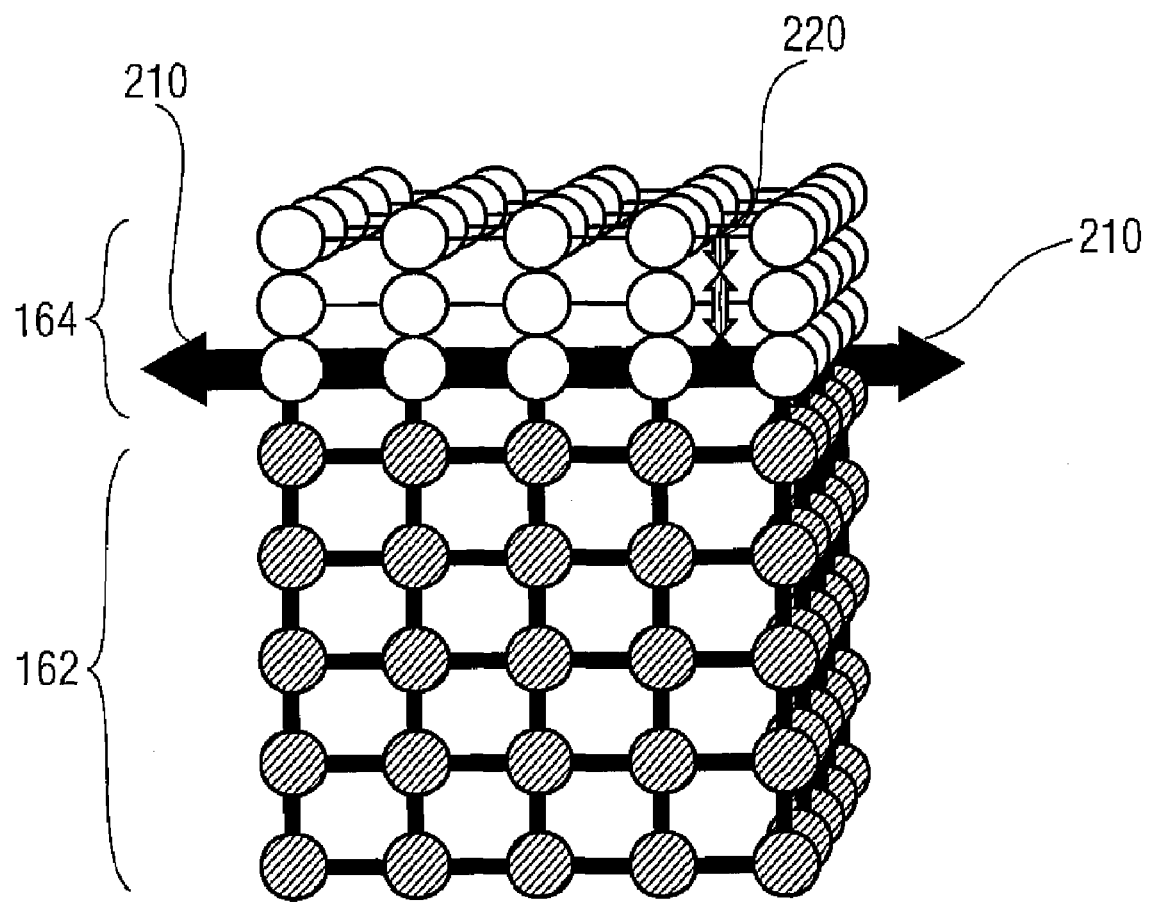
FIG. 10 illustrates a lattice illustration of a strained surface layer.

FIG. 10 illustrates a lattice illustration for the strained semiconductor layer 164, which is grown on the underlying area of the base layer 162. As a result of a higher lattice constant of the base layer 162 as compared with the material of the semiconductor layer 164, tensile strain 210 in lateral layer expansion acts on the atoms of the semiconductor layer 164. At the same time, compressive strain 220 acts in vertical direction of the lateral layer expansion. This entails that the lattice pitch in the direction 210, that is in lateral layer expansion, is enlarged, whereas the lattice pitch in the direction perpendicular to the layer expansion is reduced. The semiconductor layer 164 thus obtained hence exhibits a strained lattice structure.

Figure 11:
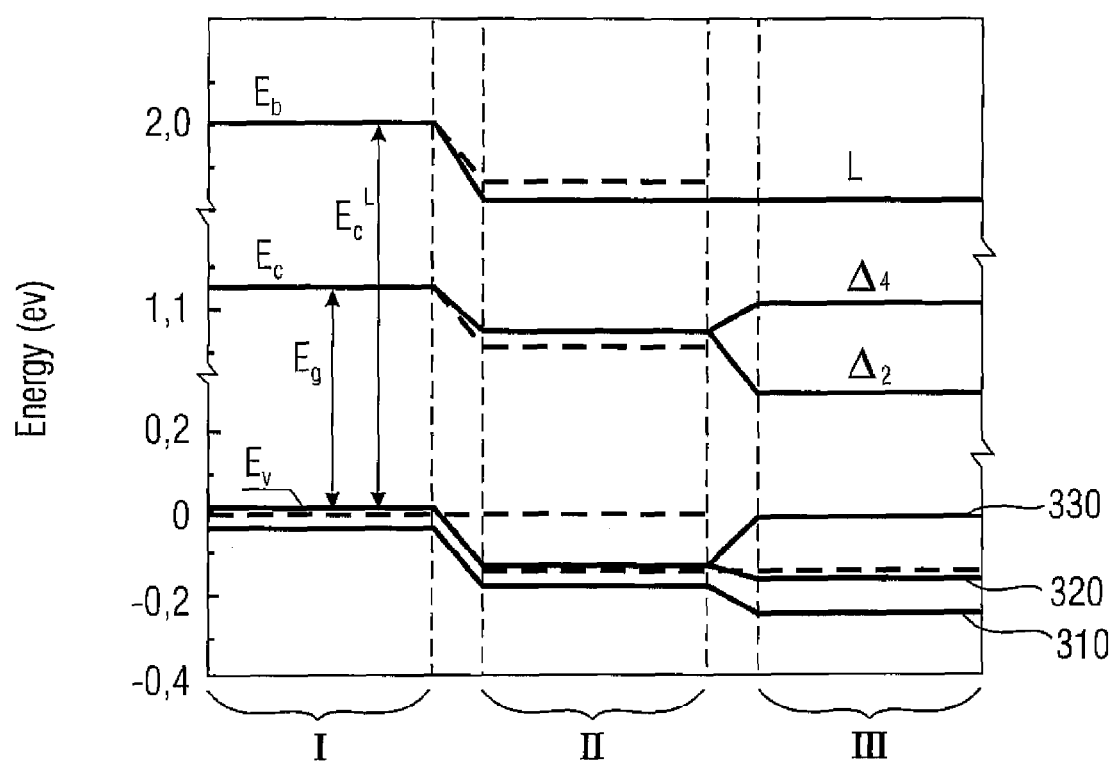
FIG. 11 illustrates a comparison of the energy band structure for a cubic lattice and a strained lattice.

FIG. 11 gives a graphical illustration for a change of the energy bands of cubic silicon, hydrostatically strained silicon, and uniaxially strained silicon (that is silicon on an $Se_{1-x}Ge_x$ background). The cubic silicon is illustrated in the area I, and three energy levels are illustrated, a valence band $E_V$, a conduction band $E_C$ (delta valley), and a conduction band $E_L$ (L valley). The gap energy between the energy level $E_C$ and the energy level $E_V$ is designated with $E_g$, and the gap energy between the energy level $E_L$ and the energy level $E_V$ is designated with $E_g^L$. In the region of hydrostatic strain, these energy levels are lowered, as it is illustrated in an area II, wherein the lowering is manifest in varying degrees. With uniaxially strained silicon, which is illustrated in an area III, splitting of the energy level arises, which means that the valence band $E_V$ is split into three parts: a bottom part 310, which corresponds to spin orbit states, a middle proportion

320, which corresponds to heavy holes, and an upper proportion 330, which corresponds to light holes. The energy level $E_C$ is split into two energy levels in the area III: a first one $\Delta_2$ and a second one $\Delta_4$. The energy level $E_L$, however, is not split up further in the area III.

As can be seen from FIG. 10, the biaxial tensile and compressive strain induces deformation of the energy bands with a corresponding influence on the electrical properties. The energy level $E_C$ leads to reduced effective mass, and hence, to increased mobility for in-plane charge carrier transport (as a result of the tensile strain). On the other hand, deformation of the energy level $E_V$ implies a reduced effective mass holes and leads to a reduced valley-to-valley scattering. The increase in electron and hole mobility increases with rising tensile strain in the silicon.

Theoretically, this may be understood as follows. The drain-source current $I_{DS}$ can be given as follows:

$$I_{DS} \sim W C_{OX} f(\mu_{eff}, L_{eff}) \tag{1}$$

with:

$$C_{OX} \sim \frac{\varepsilon_{ox}}{d_{ox}} \tag{2}$$

wherein $C_{OX}$ represents the capacitance of the gate-oxide 170, and $\mu_{eff}$ is the effective mobility of the charge carriers, W and L represent the width and length of the channel (with $L_{eff}$ and $W_{eff}$ being the effective length and width of the channel, which itself comprise no sharp boundaries). A scaling of W/L as well as the oxide parameter already are at a limit, so that further improvement can only be achieved with difficulty there. As a result, an increase in mobility is strived for by using a change of $\mu_{eff}$. The effective mobility may be illustrated here as follows:

$$\mu_{eff} = \frac{\left(\frac{L_{eff}}{W_{eff}}\right) I_{DS}}{[C_{ox}(V_{GS} - V_T) V_{DS}]}. \tag{3}$$

Thus, there is a direct connection between the effective mobility of the charge carriers and the drain-source current $I_{DS}$, as well as a dependence on the on-resistance $R_{ON}$ connected thereto. The mobility of the electrons $\mu_n$ and the mobility of the holes $\mu_p$ go into the quantities for the group velocities of the charge carriers, as follows:

$$v_n = -\mu_n E, \, v_p = \mu_p E \tag{4}$$

and thus determine the conductivity $\sigma$ by the equation:

$$\sigma = q(\mu_n n + \mu_p p) \tag{5}$$

which in turn determines the resistivity $$\rho = \frac{1}{\sigma} \tag{6}$$

wherein q is the elementary charge, $n_{n,p}$ the number of charge carriers (electrons and holes). Thus, the charge carrier mobility $\mu$ has direct influence on the conductivity $\sigma$ and the resistivity $\rho$. Germanium, for example, has a specific conductivity of about 1.45 S/m, and silicon has a specific conductivity of about $2.52 \times 10^{-4}$ S/m. The charge carrier mobility $\mu$ again determines the effective mass $m_{eff}$ by the following equation:

$$\mu \sim \frac{e \cdot t}{m_{eff}} \tag{7}$$

wherein t represents a mean scattering time. By using strongly strained silicon, the effective mass $m_{eff}$ can be reduced, and hence $\mu$ is increased, which again leads to an increase in $\sigma$ (conductivity). At the same time, strained silicon also has influence on the scattering time t, which increases correspondingly.

Hence, embodiments of the present invention lead to significant reduction of the on-resistance $R_{ON}$ by channel engineering or also by band gap engineering, which is achieved, in particular, by a strained epitaxially deposited silicon layer. The strained silicon layer may have increased charge carrier mobility depending on the degree of the strain, wherein the increase in mobility is possible, both for n- and for p-channel devices, and this may again influence the channel resistance and reduce the same. One possibility is to use a silicon-germanium layer with carbon addition (SiGe:C) and also use the same in the trench technology. Thereby, the out-diffusion of germanium into the channel can be prevented and, hence, a larger process window with respect to the maximum process temperature possible be enabled.

Instead of an addition carbon, another possibility is to use a silicon-germanium buffer layer with growing germanium proportion for continuous lattice matching, and let an almost defect-free silicon-germanium epi layer grow thereon, which may in turn be used for strain build-up in the silicon in connection with a trench technology.

In summary, embodiments of the present invention describe a vertical (trench) low-voltage MOS power transistor and a method of its manufacturing, whose electric performance can be enhanced by embedding the current-carrying channel into a thin strained layer, e.g., including silicon or a thin epitaxial silicon-germanium layer—depending on the charge carrier type and dopings. The enhanced electric performance is achieved by an increase in charge carrier mobility (holes and/or electrons) in the channel of the vertical MOS transistor (in the trench design), as explained before.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a channel formation region formed on a side wall, the channel formation region comprising a buffer layer, a base layer and a strained semiconductor layer, the base layer comprising a mixture of a first semiconductor material with a first lattice constant, a second semiconductor material and carbon, the second semiconductor material comprising a second lattice constant differing from the first lattice constant, and the buffer layer comprising a mixture of the first semiconductor material and the second semiconductor material with an increasing proportion of the second semiconductor material from the side wall to the base layer, wherein the buffer layer is arranged between the side wall and the base layer and wherein the base layer is arranged between the buffer layer and the strained semiconductor layer.

2. The semiconductor device of claim 1, comprising:
a substrate of the first semiconductor material with the first lattice constant, comprising a first source/drain region in a first depth and a second source/drain region in a second depth; and
a trench structure formed in the substrate with the side wall extending from the first source/drain region to the second source/drain region.

3. The semiconductor device of claim 2, comprising:
a gate region spaced from the channel formation region across an oxide layer.

4. The semiconductor device of claim 1, comprising:
where the semiconductor device includes an integrated circuit.

5. A semiconductor device comprising:
a substrate of a first semiconductor material with a first lattice constant comprising a first source/drain region in a first depth and a second source/drain region in a second depth;
a trench structure formed in the substrate with a side wall extending from the first source/drain region to the second source/drain region;
a channel formation region formed on the side wall, the channel formation region comprising a buffer layer, a base layer and a strained semiconductor layer, the base layer comprising a mixture of the first semiconductor material, a second semiconductor material and carbon, the second semiconductor material comprising a second lattice constant differing from the first lattice constant, and the buffer layer comprising a mixture of the first semiconductor material and the second semiconductor material with an increasing proportion of the second semiconductor material from the side wall to the base layer; and
a gate region spaced from the channel formation region across an oxide layer,
wherein the buffer layer is arranged between the side wall and the base layer and wherein the base layer is arranged between the buffer layer and the strained semiconductor layer.

6. The semiconductor device of claim 5, further comprising a semiconductor layer formed on the channel formation region and comprising a semiconductor material with a third lattice constant differing from the second lattice constant.

7. The semiconductor device of claim 6, wherein the semiconductor layer is formed epitaxially on the channel formation region.

8. The semiconductor device of claim 6, wherein the semiconductor layer has a layer thickness in a range from 5 to 15 nm.

9. The semiconductor device of claim 5, wherein the channel formation region comprises a carbon proportion of less than 2% or less than 1%.

10. The semiconductor device of claim 5, wherein the channel formation region has a layer thickness perpendicular to the side wall in a range from 10 to 50 nm.

11. The semiconductor device of claim 5, wherein the channel formation region is formed epitaxially on the side wall.

12. The semiconductor device of claim 6, wherein the first semiconductor material comprises silicon and the second semiconductor material comprises germanium and wherein the semiconductor layer comprises silicon.

13. A semiconductor device comprising:
a substrate comprising a first source/drain region in a first depth and a second source/drain region in a second depth;
a trench structure formed in the substrate with a side wall extending from the first source/drain region to the second source/drain region;
a channel formation region formed on the side wall, the channel formation region comprising a buffer layer, a base layer and a strained semiconductor layer, the base layer comprising a mixture of silicon, germanium and carbon, and the buffer layer comprising a mixture of silicon and germanium with an increasing proportion of germanium from the side wall to the base layer; and
a gate region spaced from the channel formation region across an oxide layer,
wherein the substrate comprises silicon, and
wherein the buffer layer is arranged between the side wall and the base layer and wherein the base layer is arranged between the buffer layer and the strained semiconductor layer.

14. The semiconductor device of claim 13, further comprising a semiconductor layer, formed on the channel formation region and comprising silicon.

15. The semiconductor device of claim 14, wherein the semiconductor layer comprises a layer thickness in a range from 40 to 120 nm.

16. The semiconductor device of claim 14, wherein the semiconductor layer comprises a layer thickness in a range from 5 and 15 nm.

17. The semiconductor device of claim 13, wherein the proportion of the germanium in the channel formation region is constant and wherein the proportion of carbon is less than 2% or 1%.

18. The semiconductor device of claim 13, wherein the channel formation region has a layer thickness in a range from 20 to 40 nm.

19. The semiconductor device of claim 14, wherein the semiconductor layer of silicon is epitaxially formed on the channel formation region, so that the semiconductor layer comprises a strained lattice structure and charge carriers comprise an mobility increased by at least 10%.

20. The semiconductor device of claim 13, wherein a source region is formed on a substrate surface between two adjacent trenches of the trench structure, and wherein a drain region is designed on the side facing away from the substrate surface.

21. The semiconductor device of claim 20, wherein the source region and the drain region are formed by n-doped substrate regions, wherein a body region is formed by a p-doped substrate region between the source region and the drain region.

22. The semiconductor device of claim 20, wherein the source region and the drain region are formed by p-doped substrate regions, wherein a body region is formed by an n-doped substrate region between the source region and the drain region.

23. The semiconductor device of claim 13, wherein the oxide layer has a variable layer thickness, wherein the oxide layer region in less depth of the trench structure comprises less layer thickness compared to the oxide layer in more depth of the trench structure.

24. The semiconductor device of claim 1, wherein the increasing proportion is a gradually increasing proportion.

25. The semiconductor device of claim 5, wherein the increasing proportion is a gradually increasing proportion.

26. The semiconductor device of claim 13, wherein the increasing proportion is a gradually increasing proportion.

* * * * *